United States Patent
Gallestey et al.

(10) Patent No.: US 9,285,787 B2
(45) Date of Patent: Mar. 15, 2016

(54) ESTIMATING INITIAL STATES OF A SYSTEM MODEL FOR CONTROLLING AN INDUSTRIAL PROCESS

(75) Inventors: Alvarez Eduardo Gallestey, Mellingen (CH); Jan Poland, Nussbaumen AG (CH); Konrad Stadler, Niederweningen (CH); Sebastian Gaulocher, Zofingen (CH); Hamed Foroush, Lausanne (CH)

(73) Assignee: ABB RESEARCH LTD, Zurich (CH)

( * ) Notice: Subject to any disclaimer, the term of this patent is extended or adjusted under 35 U.S.C. 154(b) by 991 days.

(21) Appl. No.: 13/334,596

(22) Filed: Dec. 22, 2011

(65) Prior Publication Data

US 2012/0150507 A1 Jun. 14, 2012

Related U.S. Application Data

(63) Continuation of application No. PCT/EP2010/057148, filed on May 25, 2010.

(30) Foreign Application Priority Data

Jun. 24, 2009 (EP) .................................... 09163541

(51) Int. Cl.
*G06F 7/60* (2006.01)
*G06F 17/10* (2006.01)
(Continued)

(52) U.S. Cl.
CPC .............. *G05B 13/042* (2013.01); *B03D 1/028* (2013.01); *G05B 17/02* (2013.01); *G05B 13/041* (2013.01); *G06F 17/50* (2013.01)

(58) Field of Classification Search
CPC ...... B03D 1/028; G05B 17/02; G05B 13/042; G05B 13/041; G05B 13/04; G06F 17/5018; G06F 17/5036

USPC ........................................................ 703/2, 18
See application file for complete search history.

(56) References Cited

U.S. PATENT DOCUMENTS

2005/0154476 A1* 7/2005 Gallestey et al. ................ 700/30
2007/0143074 A1* 6/2007 Gallestey et al. ............. 702/182

FOREIGN PATENT DOCUMENTS

EP 1607809 A1 12/2005

OTHER PUBLICATIONS

Jingjing Du et al., "Modeling and Control of a Continuous Stirred Tank Reactor Based on a Mixed Logical Dynamical Model", Aug. 2007, Chin. J. Chem. Eng. 15(4).*

(Continued)

*Primary Examiner* — Dwin M Craig
*Assistant Examiner* — Cedric D Johnson
(74) *Attorney, Agent, or Firm* — Buchanan Ingersoll & Rooney PC

(57) ABSTRACT

A model-based control of an industrial process using a merged MLD system model is provided for the estimation and subsequent control of the process. An optimization of an objective function is performed. The objective function includes a difference between an observed quantity and an output variable of a Mixed Logical Dynamic (MLD) system model of the process. The optimization is performed as a function of state variables of the MLD system model, over a number of time steps in the past, and subject to constraints defined by the MLD system model's dynamics. The optimizing values of the state variables are retained as estimated initial states for subsequent control of the process in a model-based manner including the same MLD system model. The single MLD system model is a combination or merger of individual MLD subsystem models representing the sub-processes of the process, and may be elaborated during a customization step.

20 Claims, 4 Drawing Sheets

(51) Int. Cl.
*G05B 13/04* (2006.01)
*B03D 1/02* (2006.01)
*G05B 17/02* (2006.01)
*G06F 17/50* (2006.01)

(56) References Cited

OTHER PUBLICATIONS

Gaulocher, Sebastian et al., "Advanced Process Control of a Froth Flotation Circuit", Oct. 2008, Proceedings of the Fifth International Seminar on Mineral Processing, Procemin.*

Ikeda, Kenji et al., Continuous-Time Model Identification by Using Adaptive Observer—Estimation of the Initial State, Oct. 18-21, 2006, SICE-ICASE International Joint Conference, ICASE.*

Gallestey, Eduardo et al., Using Model Predictive Control and Hybrid Systems for Optimal Scheduling of Industrial Processes, 2003, Oldenbourg Verlag.*

Bemporad, Alberto "Model Predictive Control Design: New Trends and Tools", Dec. 13-15, 2006, 45th IEEE Conference on Decision & Control, IEEE.*

Nandola, Naresh N. et al., "A Multiple Model Approach for Predictive Control of Nonlinear Hybrid Systems", Jul. 20, 2007, Elsevier Ltd.*

International Search Report (PCT/ISA/210) issued on Sep. 6, 2010, by European Patent Office as the International Searching Authority for International Application No. PCT/EP2010/057148.

International Preliminary Report on Patentability (PCT/IPEA/409) issued on Jun. 9, 2011 by European Patent Office as the International Examining Authority for International Application No. PCT/EP2010/057148.

European Search Report issued Jan. 28, 2010 for European Application No. 09163541.7.

Kenji Ikeda et al., Continuous-time model identification by using adaptive observer—Estimation of the initial state—, SICE-ICASE International Joint Conference 2006, pp. 1796-1799.

Hamed Shisheh Foroush et al., Model-Predictive Control of the Froth Thickness in a Flotation Circuit, pp. 1-10.

Alberto Bemporad et al, Control of systems integrating logic, dynamics, and constraints, Automation 35, 1999, pp. 407-427.

Eduarto Gallestey et al., Using Model Predictive Control and Hybrid Systems for Optimal Scheduling of Industrial Processes, Automatisierungstechnik 51, 2003, pp. 285-293.

* cited by examiner

ESTIMATING INITIAL STATES OF A SYSTEM MODEL FOR CONTROLLING AN INDUSTRIAL PROCESS

RELATED APPLICATION

This application claims priority as a continuation application under 35 U.S.C. §120 to PCT/EP 2010/057148, which was filed as an International Application on May 25, 2010 designating the U.S., and which claims priority to European Application 09163541.7 filed in Europe on Jun. 24, 2009. The entire contents of these applications are hereby incorporated by reference in their entireties.

FIELD

The present disclosure relates to the field of industrial process modeling, optimal control and advanced scheduling.

BACKGROUND INFORMATION

Many industries rely on control systems in order to control processes in specific and predictable ways. Correctly defining operating parameters and control strategies for such control systems is vital for the success of the systems, and several different techniques exist for achieving this success. It will be readily appreciated that suitable control systems are vital for a range of different industries, and that the techniques and methods to be discussed below are applicable to a wide range of processes. One example of such a process is level control of interconnected tanks. This is a common problem in many industries, such as the chemical, pharmaceutical, and food industries, the minerals processing industry, the pulp and paper industry, the oil and gas industry, and the water treatment industry. More generally, level control is important in all processes where liquids or suspensions are transformed, stocked, or separated.

A flotation circuit, for example as illustrated in FIG. 1 of the accompanying drawings, has the purpose of separating valuable minerals from worthless material. Both of which are contained in a suspension of ground ore in water (so-called pulp). The separation is achieved by exploiting the hydrophobic character of certain minerals, for example, sphalerite, an important zinc mineral. The plant is usually composed of a number of interconnected flotation cells. Intermediate storage tanks and mixing tanks may be part of such a circuit as well.

The example flotation system shown in FIG. 1 includes a series of flotation tanks. The first tank receives an input flow. The tanks are interconnected using pipes and valves. The third tank in the series has an output for waste material. Each of the tanks has an output for the separated material. The fluid level in each tank is represented by a marking line. Accordingly, the different components that have to be modeled include containers, such as a flotation cell, intermediate storage tank (in most of the cases, this refers to a pump box), and a mixing tank, connectors, meaning pipes, and outlets, sensors, such as volume flow rate, froth layer thickness or pulp level, and valve opening percentage sensors, and actuators, such as control valves, and pumps.

Precise level control of the different flotation cells is of foremost importance for flotation because the froth layer thickness, that is, the thickness of the froth layer swimming on top of the liquid pulp phase, has a significant influence on the quantity and composition of the concentrate obtained from these cells. More details as well as an introduction to the various control techniques available are disclosed in the article "Model-Predictive Control of the Froth Thickness In a Flotation Circuit", by H. S. Foroush, S. Gaulocher, E. Gallestey, to be presented at Procemin 2009, Dec. 4, 2009, Santiago de Chile.

Model-predictive control (MPC) using a black-box model is an option for performing level control. The main drawback is the necessity of doing lengthy step tests in order to identify a plant model. These tests may require conditions close to a steady-state, which is a rare case in level control. Furthermore, once a black-box model is identified, it will not be modified during operation anymore. Therefore, it cannot account for process variations or the necessity of using a different linearization point.

Mixed logical dynamical (MLD) systems, as introduced, for example, in the article "Control of Systems Integrating Logic, Dynamics, and Constraints", A. Bemporad and M. Morari, Automatica 35(3), 1999, pp 407-427, represent a mathematical framework for modeling systems described by interacting physical laws, logical rules, and operating constraints, generally called "hybrid systems". MLD systems are determined or described by linear dynamic equations subject to linear mixed-integer inequalities involving both continuous, e.g., real-valued, and binary, e.g, Boolean-valued, variables. The variables include continuous and binary states x, inputs u and outputs y, as well as continuous auxiliary variables z and binary auxiliary variables $\delta$, as described in the following equations:

$$x(t+1)=Ax(t)+B_1u(t)+B_2\delta(t)+B_3z(t) \quad \text{(Eqn. 1a)}$$

$$y(t)=Cx(t)+D_1u(t)+D_2\delta(t)+D_3z(t) \quad \text{(Eqn. 1b)}$$

$$E_2\delta(t)+E_3z(t)<=E_1u(t)+E_4x(t)+E_5 \quad \text{(Eqn. 1c)}$$

In general, the variables mentioned are vectors and A, $B_i$, C, $D_i$, and $E_i$ are matrices of suitable dimensions.

In order to be well posed, the above MLD system must be such that for any given x(t) and u(t) the values of $\delta(t)$ and z(t) are defined uniquely. Formulations or relationships as Eqns. 1 appear naturally when logical statements are written as propositional calculus expressions, or when bounds on the states are set explicitly. Among the advantages of the MLD framework is the possibility to generate automatically the matrices of MLD systems from a high-level description. MLD systems generalize a wide set of models, among which there are linear hybrid systems and even nonlinear systems whose nonlinearities can be expressed or at least suitably approximated by piecewise linear functions.

EP 1 607 809 describes the combination of arbitrarily connected MLD systems in order to model and control complex industrial systems. In EP 1 607 809, a combined model is obtained that makes use of auxiliary variables to provide the overall model. In addition, EP 1 607 809 describes the use of Model Predictive Control (MPC) using a merged MLD system. As described above, MPC is a procedure of solving an optimal-control problem, which includes system dynamics and constraints on the system output, state and input variables. The main idea of model predictive control is to use a model of the plant or process, valid at least around a certain operating point, to predict the future evolution of the system. Based on this prediction, at each time step t the controller selects a sequence of future command inputs or control signals through an on-line optimization procedure, which aims at optimizing a performance, cost or objective function, and enforces fulfillment of the constraints. Only the first sample of the optimal sequence of future command inputs is actually applied to the system at time t. At time t+1, a new sequence is evaluated to replace the previous one. This on-line re-planning provides the desired feedback control feature. Model Predictive Control can be applied for stabilizing a MLD system to an equilibrium state or to track a desired reference trajectory via feedback control.

Model predictive control (MPC) in combination with a Mixed Logical Dynamical (MLD) systems description has been used for modeling and control of processes in the utility automation and process industry. By way of example, a method of scheduling a cement production is described in the article 'Using Model Predictive Control and Hybrid Systems for Optimal Scheduling of Industrial Processes', by E. Gallestey et al., published in AT Automatisierungstechnik, Vol. 51, no. 6, 2003, pp. 285-293.

In order to perform the optimization, MPC requires the current state of the plant as a starting point for optimization, or at least a good estimate. In the case of complex plants, the state may be not fully observable due to a limited number of sensors or unfavorably positioned sensors. Here, state estimation is necessary in order to obtain an estimate of the plant state. Moreover, state estimation can be used independently of model predictive control, namely for other control methods or even without control at all (e.g., diagnostics, monitoring, or operator decision support).

SUMMARY

An exemplary embodiment of the present disclosure provides a method of estimating initial states of a system model for an industrial process with a plurality of sub-processes. The exemplary method includes optimizing, as a function of state variables x, an objective function J including a difference between observed quantities y and outputs $\hat{y}$ of a merged Mixed Logical Dynamic (MLD) system model for the industrial process. The optimization is performed over a number of time steps in the past and being subject to constraints defined by the dynamics of the merged MLD system model. The merged MLD system model is a combination of MLD subsystem models representing the sub-processes of the industrial process. The exemplary method also includes retaining optimizing values $x_0$ of the state variables at an ultimate time step as an estimated initial state for control, based on the merged MLD system model, of the industrial process, wherein the state variables include an intermediary state variable. The exemplary method also includes excluding the intermediary state variable from the optimization, and simulating a value of the intermediary state variable at the ultimate time step by evaluating the MLD system model, and retaining the simulated value in the estimated initial state $x_0$.

An exemplary embodiment of the present disclosure provides a device for controlling an industrial process, based on an estimated initial state and a merged Mixed Logical Dynamic (MLD) system model of the industrial process, the merged MLD system model being a combination of MLD subsystem models representing sub-processes of the industrial process. The device includes a processor configured to: optimize, as a function of state variables x, an objective function J including a difference between observed quantities y and outputs $\hat{y}$ of the merged MLD system model for the industrial process, where the optimization is performed over a number of time steps in the past and being subject to constraints defined by dynamics of the merged MLD system model; retain optimizing values $x_0$ of the state variables at an ultimate time step as the estimated initial state; exclude the intermediary state variable from the optimization; and simulate a value of the intermediary state variable at the ultimate time step by evaluating the MLD system model, and retain the simulated value in the estimated initial state $x_0$.

An exemplary embodiment of the present disclosure provides a non-transitory computer-readable recording medium having a program recorded thereon that causes a processor of a computer processing device to estimate initial states of a system model for an industrial process with a plurality of sub-processes. The program causes the processor to execute an operation including optimizing, as a function of state variables x, an objective function J including a difference between observed quantities y and outputs $\hat{y}$ of a merged Mixed Logical Dynamic (MLD) system model for the industrial process, where the optimization is performed over a number of time steps in the past and being subject to constraints defined by the dynamics of the merged MLD system model, and where the merged MLD system model is a combination of MLD subsystem models representing the sub-processes of the industrial process. The program also causes the process to execute operations including: retaining optimizing values $x_0$ of the state variables at an ultimate time step as an estimated initial state for control, based on the merged MLD system model, of the industrial process, wherein the state variables including an intermediary state variable; excluding the intermediary state variable from the optimization; and simulating a value of the intermediary state variable at the ultimate time step by evaluating the MLD system model, and retaining the simulated value in the estimated initial state $x_0$.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
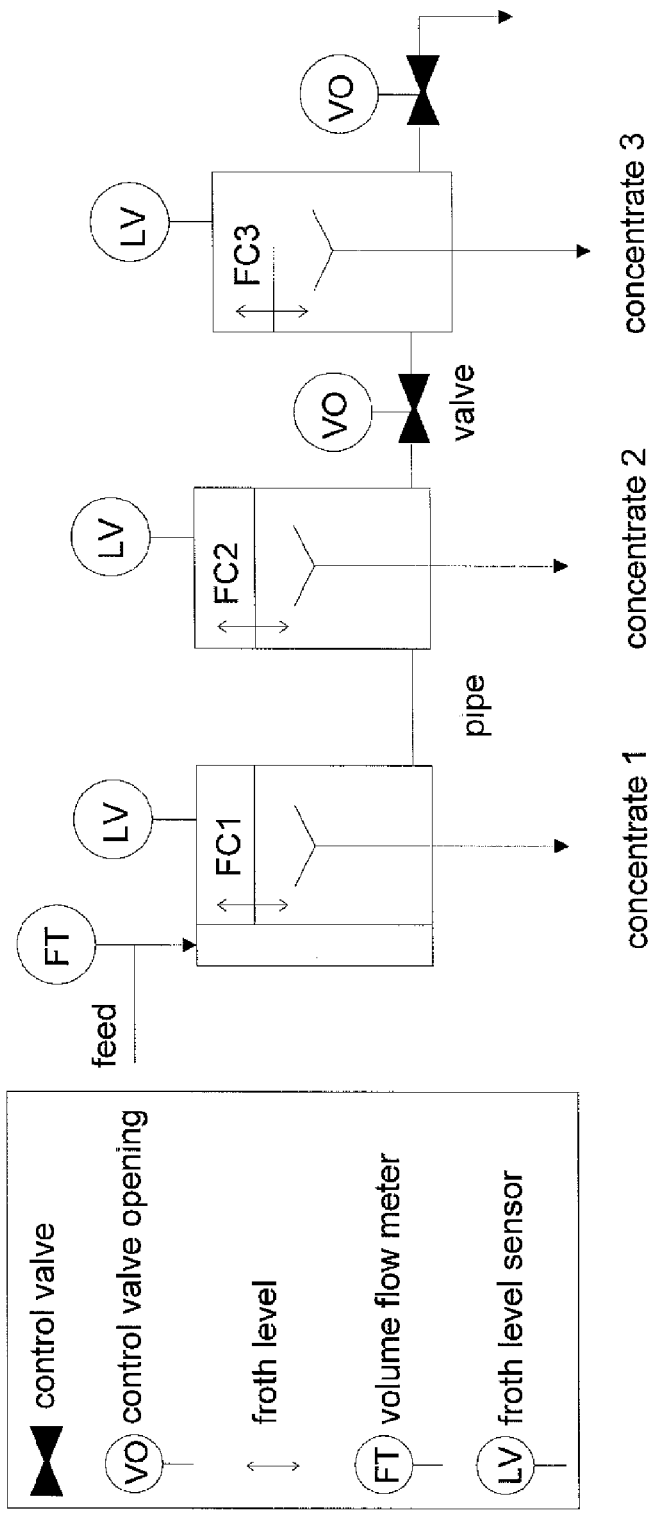
FIG. 1 illustrates a flotation system as a first industrial plant according to an exemplary embodiment of the present disclosure.

Exemplary embodiments of the present disclosure provide a model-based control of industrial processes or industrial production plants. This objective is achieved by a method of estimating initial states of a system model for an industrial process with a plurality of sub-processes, as well as a device and a computer program for controlling an industrial process as described hereinafter. The computer program is tangibly recorded on a non-transitory computer-readable recording medium (e.g., a non-volatile memory) and causes a processor of a computer processing device to control an industrial process as described hereinafter.

According to an exemplary embodiment of the present disclosure, an optimization of an objective function is performed, wherein the objective function includes a difference between an observed, or measured, quantity and an output variable of a Mixed Logical Dynamic (MLD) system model of the industrial process or production plant. The optimization is performed as a function of state variables of the MLD system model, over a number of time steps in the past, and subject to constraints defined by dynamics of the MLD system model. The optimizing values of the state variables are retained as estimated initial states for subsequently controlling the industrial process or production plant in a model-based manner including the MLD system model. The single MLD system model is a combination or merger of individual MLD subsystem models representing the sub-processes of the industrial process, and may thus be elaborated by a commissioning engineer during a customization step on a plant site, and hence at a comparably late moment during plant execution. The use of a merged MLD system model for both the estimation and subsequent control of industrial processes or production plants simplifies and expedites the set-up of model based control together with accurate estimation of initial states.

An important aspect when targeting a robust behavior of the state estimation is observability. If there are too few measurements or if there is too much noise or model mismatch to make all states observable, ways have to be found to reduce the degrees of freedom in the model during the estimation procedure. The following exemplary embodiments describe respective refinements of a standard Moving Horizon Estimation (MHE).

In accordance with an exemplary embodiment, the optimization process is simplified by excluding certain intermediary state variables and reducing the dimension and complexity of the operation correspondingly. In order to complete the estimate of the initial state for the subsequent control involving all state variables, suitable values, possibly less precise, of the excluded variables are simulated or calculated directly from the MLD model.

In accordance with an exemplary embodiment, an intermediary sub-process, for example, having state variables with limited observability, is identified which interconnects or links two peripheral or neighboring sub-processes, wherein the latter, or their MLD subsystem models respectively, are exclusively interacting with each other via the intermediary sub-process or subsystem model, respectively. By excluding from the optimization the state variables of the latter, the merged MLD system model is split or cut into two independent or disconnected subsystem models representing the peripheral sub-processes, which further simplifies the estimation of the initial states.

In accordance with an exemplary embodiment, so-called artificial observations are used as a means to make the model more stable during the optimization process. To this end, a regularization term including a convex function of a difference between a piece-wise liner function of the model outputs or variables and an artificial observation is added to the objective function. Alternatively or in addition thereto, at selected time steps of the optimization, an artificial observation is assigned to the function of the model outputs. This is equivalent to a non-permanent additional hard constraint enforcing an exact solution. The artificial observation is predetermined based on some expert knowledge regarding, for example, a plausible initial state, or based on calculated values from outside the MLD model, for example, from another simulation or a fuzzy system.

In accordance with an exemplary embodiment, so-called correction or bias terms are introduced which are capable of estimating a non-zero mean of process or measurement noise. A bias term is implemented as a single state which is constant over the estimation horizon but subject to process noise. A different implementation is a first order filter with a constant as an input. This constant can be zero or some low-pass filtered version of the bias, causing a corresponding decay of the bias term during MPC. By doing so, model mismatch can be compensated and changing process conditions can be accounted for, which is important in order to gain and maintain the predictive power of the model.

In accordance with an exemplary embodiment, the merging of a first and second subsystem includes a step of eliminating, as far as possible, dependent inputs of the second subsystem that are connected to dependent outputs of the first subsystem. The merged system becomes leaner with less auxiliary variables to be optimized. On the other hand, the remaining dependent inputs, including, for example, those which close algebraic loops in the merged MLD system, are replaced by additional auxiliary real and/or Boolean variables of the merged MLD system.

In accordance with an exemplary embodiment, the method can be applied to complex industrial processes or production plants such as floatation process or cement kiln that are unique and require a lot of individualization, due to, for example, plant specific customer requirements or regulations.

Figure 2:
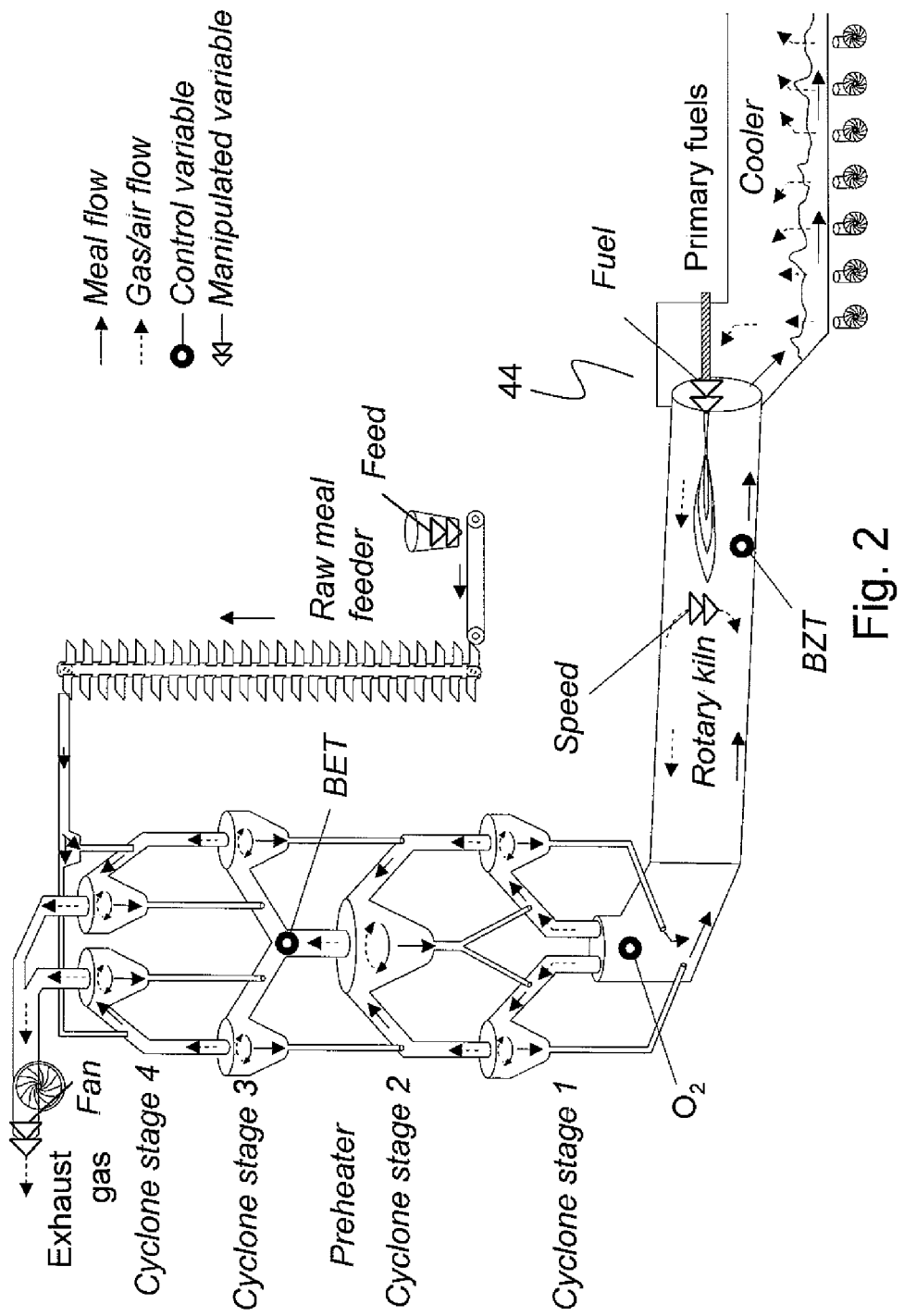
FIG. 2 depicts a clinker production unit as a second industrial plant according to an exemplary embodiment of the present disclosure.

FIG. 2 shows a specific process configuration of a clinker production unit according to an exemplary embodiment of the present disclosure. The clinker unit is shown with a preheater, rotary kiln, and cooler as its main constituents, which may be subdivided into, or merged from, a number of subsystems. In particular, the actual kiln process is divided into five zones or compartments, for example, preheating, calcining, transition, sintering and cooling. Each of them is modeled by an MLD model suitably configured in order to capture the different characteristics of the different zones. A coarse modeling of the kiln with only three compartments plus an additional preheating compartment at the back and an additional cooler compartment at the front of the kiln proved to be a good compromise reconciling accuracy and computational robustness. Additionally, in parallel to the thermodynamic and mass transport model described by the interconnection of the compartment models, an oxygen model was introduced.

As depicted in the example of FIG. 2, manipulated variables or inputs include a raw meal feed rate, exhaust gas flow rate, kiln rotational speed, and primary fuel flow rate. The interconnection of the compartment models is described by thermodynamic and mass transport models, which results in states of different zones being connected. Basically, every manipulated variable and every observed variable, or the corresponding sensor, represents a sub-process. In particular, sensor sub-processes for oxygen level (O2), Burning Zone temperature (BZT), and preheater cyclone Temperature (BET) were introduced.

Figure 3:
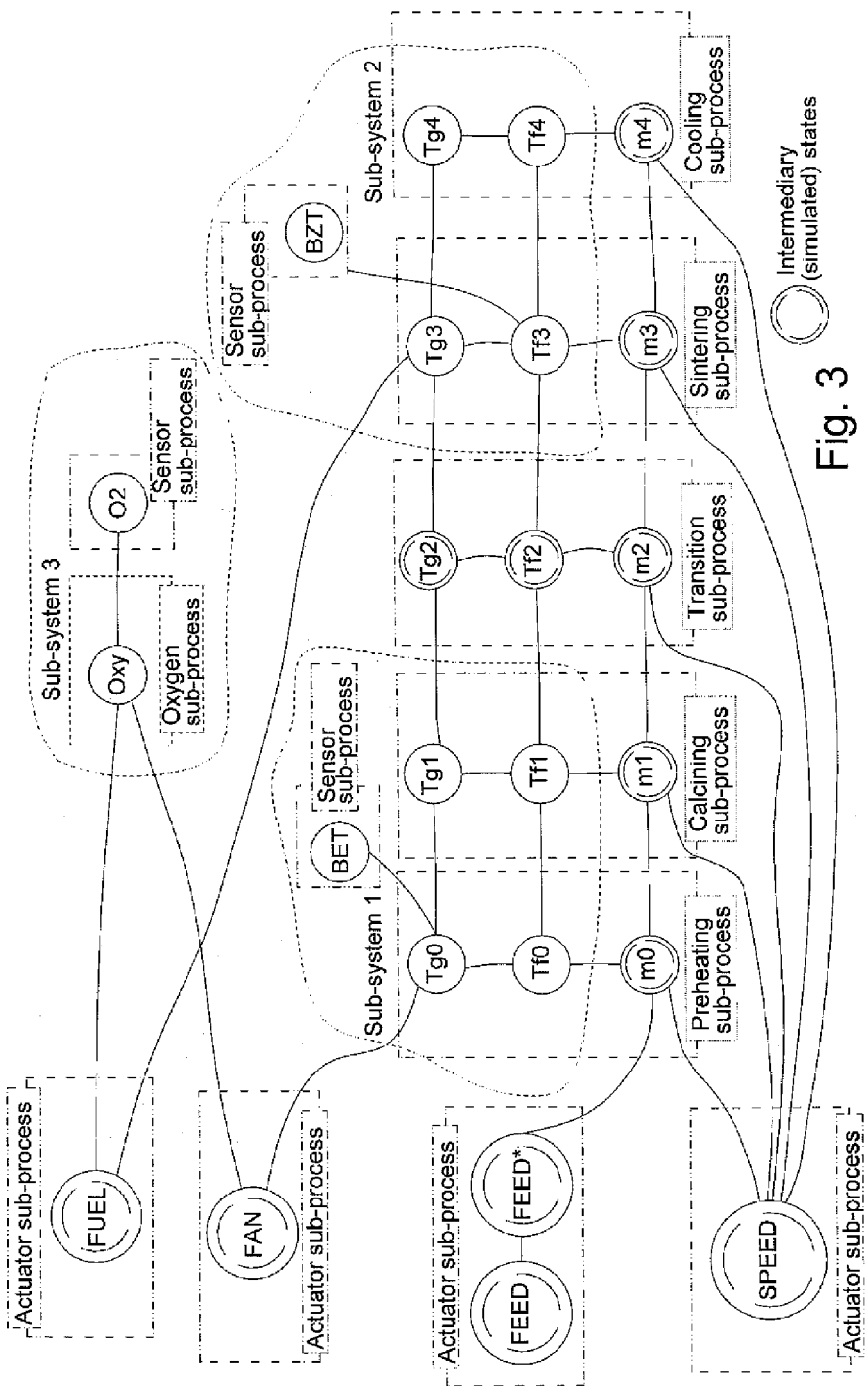
FIG. 3 depicts a model of the clinker production unit according to an exemplary embodiment of the present disclosure.

FIG. 3 depicts the set-up of the model of the clinker production unit of FIG. 2 for estimation according to an exemplary embodiment of the present disclosure, with model states being depicted as circles, the subsystems indicated as rectangles, and continuous lines representing direct state connections. The sub-systems as indicated by the broken lines define the three independent estimation problems generated by introducing the cuts by means of intermediary states being simulated. This way, the complex far interactions in between the parts which are difficult to understand and prone to instability are eliminated. In the particular kiln example, this technique was applied to the middle compartment, thus essentially dividing the kiln in a front part and a back part.

Figure 4:
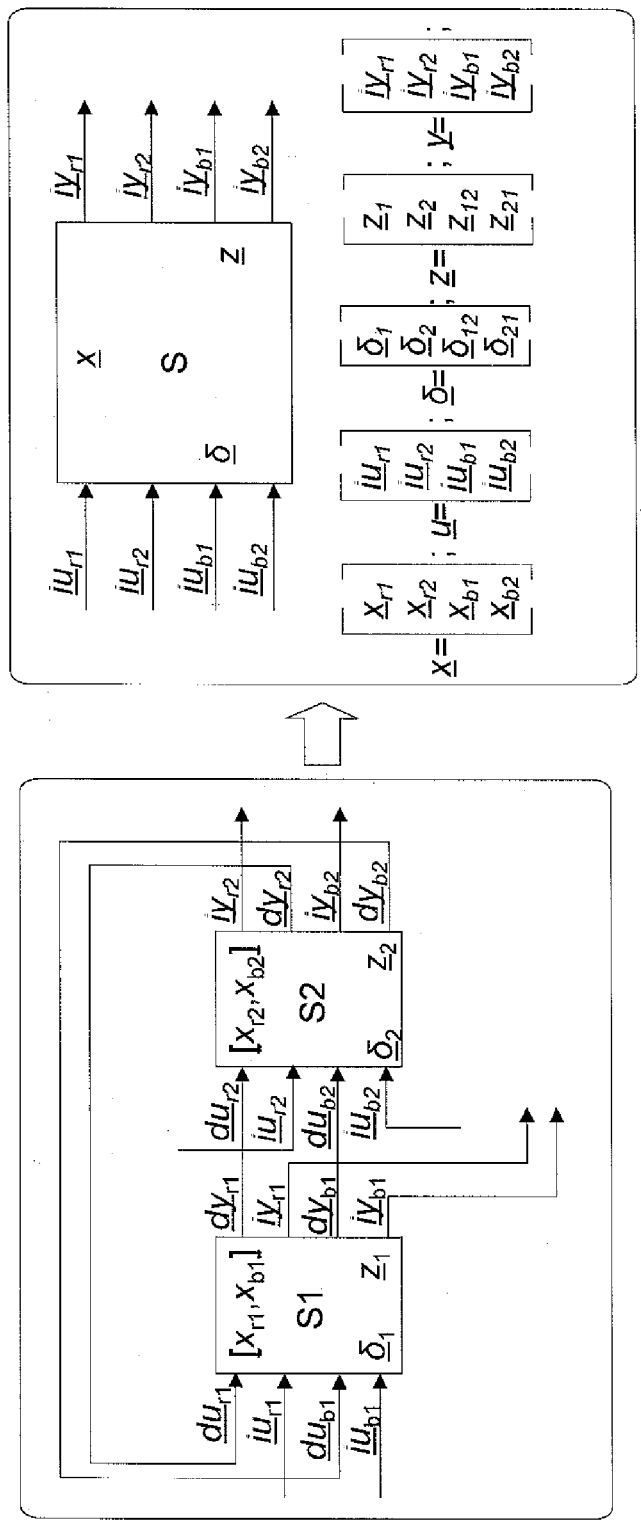
FIG. 4 illustrates a merging of two MLD subsystems into a combined MLD system according to an exemplary embodiment of the present disclosure.

FIG. 4 shows two MLD blocks or subsystems S1 and S2, defined respectively by respective groups of matrices A1, B11 . . . 3, C1, D11 . . . 3, E11 . . . 5 and A2, B21 . . . 3, C2, D21 . . . 3, E21 . . . 5 as well as by the vectors of states x1, x2, the vectors of inputs u1, u2, the vectors of outputs y1, y2, the vectors of real auxiliary variables z1, z2 and the vectors of Boolean auxiliary variables, δ1, δ2. The MLD subsystem S1, S2 are interconnected as indicated by the arrows joining the two blocks. The goal is to merge S1 and S2 in order to obtain one single or combined MLD system S described by the matrices A, B1 . . . 3, C, D1 . . . 3, and E1 . . . 5 and the corresponding vectors of states x, inputs u, and outputs y, without the use of auxiliary variables.

The matrices of the combined system S are obtained by creating matrices including the corresponding matrices of the subsystems S1, S2 along their diagonal as a starting point, subsequently eliminating or exchanging rows and/or columns as explained below. Likewise, the vectors of the combined system S are created by augmenting the vectors of Si with the corresponding vectors of S2 as a starting point, and by subsequently eliminating or rearranging their elements if necessary. It is to be noted that the matrices and vectors of the combined system S are uniquely designated and maintain their designation throughout the subsequent operations performed on their rows, columns or elements.

The vectors of states, inputs and outputs can contain both real (denoted with the index r) and Boolean (index b) variables. If this is the case, all the real variables may be grouped and placed in the corresponding vector before the Boolean ones. Among the inputs and outputs certain variables are independent of the other MLD block (denoted with the prefix i) and some are dependent (prefix d). Pairs of the dependent variables are represented in FIG. 1 by a common arrow pointing from one MLD block (S1, S2) to the other MLD block (S2, S1).

The treatment of the embodiment according to FIG. 2 will be detailed in the following, yet less general configurations with, for example, only one, two or three pairs of dependent variables are also conceivable and can be treated in the framework of the present disclosure.

The resulting state vector x of the combined MLD block S includes a composition of all the states of S1 and S2 and is defined as x=[xr1,xr2,xb1,xb2]. Due to the real variables of both systems being placed before the Boolean variables, the matrix A of the combined MLD system S, based on the matrices A1, A2 of the subsystems S1, S2 as shown above, has to have the rows and columns corresponding to xb1 swapped with the rows and columns of xr2. Likewise, the other matrices B1 . . . 3 involved in the state dynamic of the system S, based on the corresponding matrices B11 . . . 3, B21 . . . 3 of the subsystems S1, S2, undergo, in a first step, a corresponding swap of rows. Equally, in a first step a swap of columns is executed on the matrices C, E4 of the system S multiplying the resulting state vector x and being based on the corresponding matrices (C1, E14; C2, E24) of the subsystems S1, S2.

The resulting output vector y of the combined MLD block S includes a composition of the independent outputs of S1 and S2 and, taking into account the real before Boolean principle, is defined by y=[iyr1, iyr2, iyb1, iyb2]. Again, the matrices involved in the output dynamic (C, D1 . . . 3) of the system S are based on the corresponding matrices (C1, D11 . . . 3, C2, D21 . . . 3) of the subsystems S1, S2. Along the same idea, the rows of these matrices corresponding to iyb1 will have to be swapped in a first step with the rows corresponding to iyr2. Additionally, as the dependent outputs are lost, the corresponding rows of the C, D1 . . . 3 matrices have to be deleted.

The resulting input vector u of the combined MLD block S includes a composition of the independent inputs of S1 and S2 and is defined as u=[iur1, iur2, iub1, iub2]. Again, the real variables of both systems are being placed before the Boolean variables. The dependent inputs have been dropped. This implies that the input matrix B1, in a second step, will undergo a swap between the columns corresponding to iub1 and iur2, and in a third step, will have to have the columns corresponding to the dependent inputs deleted. Likewise, the other input matrices D1, E1 of the system S, being based on the matrices (D11, E11; D21, E21) of the subsystems S1, S2, will undergo a swap of columns between iub1 and iur2 and, in a second step, will have the columns corresponding to the dependent inputs (dur1, dur2, dub1, dub2) deleted.

In accordance with an exemplary embodiment of the present disclosure, variables are eliminated, without the introduction of auxiliary variables. Each dependent input u1 to be eliminated is connected to some output y1, which is given as a linear combination y1=C1x+D11u+D12δ+D13z. Since u1=y1, each occurrence of a u1 can be straightforwardly replaced by the corresponding linear combination as long as the coefficient of u1 in D1 is equal to zero.

In other words, suppose the second input of the first MLD is connected to the $5^{th}$ output of the second MLD, i.e., $u^1_2=y^2_5$. The variable $u^1_2$ is removed from the merged MLD. That is, the second column of $B_1/D_1/E_1$ is removed. Any non-zero entry in that second column (e.g., any non-zero value in either of $B_1, D_1, E_1$) must cause the coefficients of the other variables in the same row to be increased by according multiples of the coefficients of $y^2_5$, such that the output of the row remains correct.

This method can only be used if in the column to be removed (the second column of $B_1/D_1/E_1$ in the above example), the entry at the defining row (this was $y^2_5$ above) is 0, since otherwise the replacement would not be complete. The entry is not zero in case of an algebraic loop. If the entry in question is known and different from 1, then the algebraic loop can be resolved by resolving the equation. If the entry in question is 1 (or it is symbolic and hence could be 1), this is not possible. In this case, the "merging with an additional auxiliary variable" procedure is used instead as described below.

The eliminated real dependent inputs will then be substituted by additional real auxiliary variables added to the real auxiliary variables z of the combined system S. Thus the real auxiliary variables of the MLD system include the original auxiliary variables of S1 and S2 plus the ones introduced by the S1-S2 and S2-S1 real interconnections. Similarly, the Boolean dependent inputs will be replaced by additional Boolean auxiliary variables added to the Boolean auxiliary variables of the combined system S.

This transformation is obtained or executed by appending the columns deleted from the matrices B~, D1 and E1 (observing a change of sign for the latter) to the matrices B3, 03, and F3 if real or to the matrices B2, 02, and E2 if Boolean.

The equations between the dependent inputs and outputs of the two subsystems S2 and S1 represent the connections between the subsystems. The information contained therein has to be retained and included in the formulation of the combined MLD system S. However, as the dependent variables do not appear in the final formulation, this is not a straightforward task. In the case of the S1-S2 connection (short straight arrows in FIG. 1), the original expression for the dependent outputs of subsystem S1 is included in the set of equations:

$$y1 = C1x1 + D11u1 + D12\delta1 + D13z1 \qquad (4).$$

As a result of the row-elimination procedure above, these expressions for dyi are absent from the resulting equations for the output variable y of the combined MLD block S.

The merged MLD system S resulting from the procedure outlined above in turn can be considered as a subsystem itself. Via iterated application of the procedure, a complex MLD system representing all relevant technical aspects of an arbitrarily complex industrial installation or process can be generated. Thereby order of merging of the basic' MLD subsystems or "atomic" MLD blocks do not have any impact on the final result and may be chosen at will.

In order to use the MLD system for a model based control procedure, an objective function or cost function is defined. In the context of the present disclosure, this is most conveniently done via adding a functional MLD subsystem including exactly one independent scalar output variable representing the objective to be optimized. This functional MLD subsystem is ultimately merged to the complex MLD system representing all relevant technical aspects of the physical process. Thereby, all the outputs of the complex MLD system that are related to costs are regarded as dependent outputs with corresponding dependent inputs of the functional MLD subsystem. There is no restriction on the number of independent inputs u serving as control variables or command inputs of the single-output MLD system S those results from the aforementioned ultimate merger.

We are given an industrial process which can appropriately be modeled as an MLD that is a discrete-time linear or piecewise linear dynamical system with possibly switching behavior. The MLD model has inputs (manipulated variables), outputs (sensor measurements), states, and possibly auxiliary variables. Mathematically, this reads:

$$x_{t+1} = Ax_t + B_1 u_t + B_2 d_t + B_3 z_t + B_5$$

$$y_t = Cx_t + D_1 u_t + D_2 d_t + D_3 z_t + D_5$$

$$E_2 d_t + E_3 z_t \leq E_1 u_t + E_4 x_t + E_5 \quad \text{(Eqns. 6a to 6c).}$$

Here, t denotes the time index, x contains the state vector, u the input vector, y the output vector, d and z are Boolean and real auxiliary variables, respectively, and the capital letters denote the matrices that define the dynamics of the MLD.

A technique embodying the present disclosure provides an improved method using the merged MLD model as an input for state estimation, based on the following steps. Fix a number of past time steps, which is known as the estimation horizon. Some of the outputs of the merged MLD model which describes the process are observed for at least a couple of time steps over the estimation horizon (observed history). The goal is to formulate an optimization problem corresponding to moving horizon estimation:

$$J = \sum_{t=-horizon+1}^{0} (y_t - \hat{y}_t)^T W_y^t (y_t - \hat{y}_t) + \sum_{t=-horizon+2}^{0} (x_t^{sim} - x_t)^t W_x^t (x_t^{sim} - x_t). \quad (7)$$

Where $\hat{y}$ is the vector of observations, we abbreviate $$y_t = Cx_t + D_1 u_t + D_2 d_t + D_3 z_t + D_5 \text{ and}$$

$$x_t^{sim} = Ax_{t-1} + B_1 u_{t-1} + B_2 d_{t-1} + B_3 z_{t-1} + B_5, \quad \text{(Eqns. 8a and 8b)}$$

and Wyt and Wxt (t denotes the time step here) contain the state and measurement weight matrices, respectively. In accordance with an exemplary embodiment, they contain the inverse squares of the state and measurement noises on the diagonal (and 0 off-diagonal); more generally, the weight matrices can be constructed from any information that is available for the state uncertainties and sensor noise. The weight matrices may depend on the time t. In case of a noise parameter being 0 (observation without noise or fully enforced state dynamics), the corresponding weight would be infinity. These cost functions are replaced by hard constraints in the optimization problem.

In a technique embodying the present disclosure, the values used to calculate the output of equation 7 are provided by the combined MLD model, arrived at by the technique described above.

The current time is t=0 and the usual aim of the estimation is to determine the vector x0. Weights corresponding to non-observed values need to be set to 0, in this case, the corresponding entries of $\hat{y}$ will not matter.

In certain cases (e.g., Booleans are present, and the resulting mixed integer quadratic problem cannot be solved for some reason), the quadratic cost functions above may be replaced by corresponding linear cost functions, where the weights become the inverse of the state and measurement noises respectively (without squares).

The optimization variables in the optimization problem above are the states xt, more precisely the sequence of states {xt} over the horizon. However, only the last element of this sequence, x0, is of interest because it represents the estimate of the current plant state.

Although the above formulation of the cost function J above may be altered, for example, a so-called arrival cost penalizing the gap between the previous and the current state estimate may be added, the fundamental principle is always the same—finding a reasonable trade-off between the confidence in the quality of the measurements and the confidence in the quality of the process model.

The above-mentioned state-estimation problem is formulated and solved in regular time intervals, for example, at every time step corresponding to the sampling period of the discrete-time model. This fact, together with a controller that is executed in regular time intervals as well and uses the state estimates as input information, closes the control loop.

The technique embodying an exemplary embodiment of the present disclosure uses moving horizon estimation which has a merged MLD model as its input. In such a technique, variables in the system which are known (perfectly observed) can be eliminated from the optimization problem before solving. This can considerably facilitate the optimization, in particular if applied for Boolean variables.

Constraints such as physical bounds on the state variables can be handled in such a technique with ease. At every time step, the estimator always considers the whole estimation horizon, covering a sufficiently long period of time in the past, so that in certain cases, a dynamical phenomenon in the past can be explained by more recent measurements. The MLD framework allows for easily building up first-principles models, making it straightforward to engineer (e.g., maintain, adapt, and configure) the model and the estimator. The engineer has more freedom when it comes to modeling the process because states can be defined that are not directly measurable, but can only be inferred using state estimation. In summary, our disclosure is a systematic and powerful way of estimating the dynamical states of a dynamical model.

A method embodying an exemplary embodiment of the present disclosure is able to generate optimization problems for estimation in a fully automatic way, using the same MLD model that is (or can be) used for the optimal control. The same method of merging MLDs as described above can be used to provide the single MLD model of the system or process for input into the state estimation method.

Given this technology for state estimation, there is a very elegant possibility to estimate adaptive bias terms. An adaptive bias term is a simple single-input single-output MLD $$x_{t+1} = x_t$$

$$y_t = x_t \quad \text{(9a and 9b)}$$

which, when used for optimal control, hence just behaves like a constant bias. In state estimation, however, the corresponding state noise allows a variation of the bias according to the measurements which are (possibly indirectly) connected to it. A lower state noise will result in a stiffer behavior of the bias; a higher state noise will render the bias more flexible. It is worthwhile to note that a bias does not have to be associated directly to a particular measurement, but can be placed almost anywhere in the model, for example, in order to estimate the feed to the process (as necessary in flotation).

One example of a complex industrial process is a cement kiln. If such a process is approximated by a first principles model where the energy balances define the main model dynamics (masses are just fed through the system), it is not sufficient to use only the measured energy states (temperatures) as states of the model. The reason for this is that the heat transfer and chemical reactions, which govern the process, take place within the kiln, where no measurements are available (except for the burning zone temperature, which is derived mainly from the kiln torque). Consequently, the measurements at the end of the kiln must be used in order to derive the energy states within the system. The described MHE technology enables engineers to customize their kiln model very quickly and efficiently to different situations and hardware of the process structures which measurements are available where and how trustworthy are they, what type of the kiln is given (e.g., preheater, precalciner, etc.), where do the gas flows enter and exit the system, where are which fuels burnt (e.g., coal, tyres, alternative fuels, etc.).

Another complex industrial process is a flotation process for separating minerals from other material, as described above with reference to FIG. 1. A supervisory controller can optimize the use of the main manipulated variables: the froth level and the air flow rate of each flotation cell. The accomplishment of the set-points for the froth levels and the air flow rates is the task of the lower-level controllers ("Level control" and "Local air PID controllers") that translate the set-points into openings of the flow valves and air valves, respectively.

The main objective is to perform close level control of the different tanks to set-points determined by either the plant operator or a higher-level controller. As the level set-point may change frequently during operation, the controller must have a good dynamic performance (adequate response time, little overshoot).

Another important topic to be dealt with is disturbance rejection. The feed flow to a flotation circuit typically varies considerable in time, depending on the upstream process (either a grinding circuit or another flotation circuit). The variations can be both in quantity and composition (e.g., varying density). A good control strategy must take the feed flow into account, whether it is directly measured or can only be inferred in an indirect way.

Due to time delays, hydrostatic coupling between tanks, recirculating flows, and the mix of slow and fast dynamics (circuit vs. single flotation cell), the dynamics of a flotation circuit are rather intricate. This means that level control performed by a human operator is not a realistic option. Furthermore, conventional control techniques have very limited capabilities in dealing with these dynamical phenomena.

A process such as a flotation circuit may change its properties slowly and gradually in time. For instance, ducts, hoses and pipes may partially clog due to solid deposits and therefore change their flow resistance. Furthermore, equipment (e.g., control valves) may wear off and change its properties. A controller should either be robust enough to preserve performance in spite of such changes and/or to be able to adapt to changing conditions.

Finally, a control (or rather state estimation) strategy should be capable of working in spite of limited instrumentation, in particular a low number of sensors or low-quality measurements.

A level control strategy with poor performance, for example, one that does not have good tracking and disturbance rejection properties, will have adverse effects on the performance of the supervisory controller and thus lead to suboptimal economical results of the flotation plant.

In the following, the general approach behind the model of a flotation cell, the most important component in a flotation circuit, will be described.

$$dVi/dt = qFi - qCi - qTi \quad (10)$$

Here, $Vi$ is the volume occupied by the pulp in flotation cell i ($i \in \{1, \ldots, N\}$, where N is the total number of flotation cells). $qFi$, $qCi$ and $qTi$ are the feed, concentrate, and tailings volume flows into/out of flotation cell i, respectively.

In order to express the abovementioned flotation cell model in the MLD framework, two further steps need to be done.

Firstly, the nonlinear model has to be linearized about an operating point. This means that the nonlinear term $qTi$ must be approximated and linearized. $qFi$ and $qCi$ are inputs to the system and are thus already linear.

Secondly, the continuous-time model must be discretized in time using an approximation such as the Explicit Euler method. Equation (10) is transformed into the following equation:

$$Vi[k+1] = Vi[k] + \Delta t \cdot (qFi[k] - qCi[k] - qTi[k]) \quad (11).$$

Once all the components used in the flotation circuit have been created, the circuit can be built up from these building blocks. The MLD framework offers everything that is needed in order to define the necessary interconnections. The overall model obtained is again of the MLD type.

An important feature that has proven successful in advanced process control (APC) of similar processes is the parameterization of the model. The parameters should be adapted automatically and in regular time intervals during operation such as to account for slow process variations.

Each component can be parameterized, where exemplary parameters are cell volumes, valve coefficients, and the operating point used for linearization. For instance, the operating point is different for different flotation cells and may also vary in time.

Referring to FIG. 1, an example goal is to control the froth layer thickness of the second flotation cell. In order to accomplish this, the following optimization problem is formulated:

$$\min u, \delta, z \, JMPC = \Sigma k = 1 \ldots N [\|y[k]SP - Cx[k] + D1u[k] + D2\delta[k] + D3z[k]\|2Q, 2 + \|u[k+1] - u[k]\|2R, 2]$$

$$s.t. E2\delta[k] + E3z[k] <= E4x[k] + E1u[k] + E5 \text{ for all } k \quad (12).$$

Here, the vector ysp contains the set-point for the various controlled variables y.

In order to influence the closed-loop behavior, the engineer can tune the weighting matrices QMPC and RMPC. For instance, a less aggressive response (less overshoot, but with a longer settling time, e.g., a smaller control bandwidth) is achievable by assigning high gains in the RMPC matrix, thus penalizing the use of control action.

Furthermore, several control objectives may be traded off against each other, for example, set-points for different flotation cells in the circuits whose level control precisions have different priorities.

Model-predictive control allows for respecting additional constraints, such as lower and upper bounds on the froth layer thickness in flotation cells which have no set-points or constraints that are an integral part of the dynamical model such as interconnecting flows between flotation cells.

In accordance with an exemplary embodiment, the optimization problem (eqn. 10) is solved at each sampling period. The result of the optimization is the sequence of control moves u[k] over the control horizon (k=0 to NMPC). However, only the first element, u[0], is of interest because its value is sent to the process as a set-point for the actuators.

Referring again to FIG. 1, there are three physical states which should be estimated in order that the MPC calculations can be completed, to do so the following objective function should be optimized at each sampling time:

$$\min x,\delta,z JMHE=\Sigma k=-N+1\ldots 0[\|x[k]-Ax[k-1]+B1u[k-1]+B2\delta[k-1]+B3z[k-1]\|2Q,2+\|y[k]-Cx[k]+D1u[k]+D2\delta[k]+D3z[k]\|2R,2]$$

$$s.t. E2\delta[k]+E3z[k]<=E4x[k]+E1u[k]+E5 \text{ for all } k \quad (13).$$

The first component of the cost function in Equation (13) describes the process noise, while the second component is the measurement noise. For exact state evolution and measurements, respectively (e.g., no process or measurement noise, respectively), the corresponding process or measurement noise term is formulated as an equality constraint instead of a part of the cost function.

Thus, the basic principle is to optimize the sequence of states over the estimation horizon in order to find the best trade-off (in a least-squares sense) between the sensor values and the model prediction.

As a result, MHE gives us the sequence of state vectors over the estimation horizon. However, we will only make use of the last element of this sequence, in other terms the best estimate of the current state of the process. This estimate then serves as an initial state for model-predictive control. However, the other elements may be used for diagnostic purposes or in order to perform subsequent parameter estimation.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of estimating initial states of a system model for an industrial process with a plurality of sub-processes, the method comprising:
   optimizing, by a processor of a computer processing device, as a function of state variables x, an objective function J including a difference between observed quantities y and outputs ŷ of a merged Mixed Logical Dynamic (MLD) system model for the industrial process, the optimization being performed over a number of time steps in the past and being subject to constraints defined by dynamics of the merged MLD system model, wherein the merged MLD system model is a combination of MLD subsystem models representing the sub-processes of the industrial process;
   retaining, by the processor, optimizing values $x_0$ of the state variables at a time step as an estimated initial state for control, based on the merged MLD system model, of the industrial process, wherein the state variables include an intermediary state variable, and the time step is an optimized time step at which the optimizing values $x_0$ of the state variables are estimated to occur;
   excluding, by the processor, the intermediary state variable from the optimization; and
   simulating, by the processor, a value of the intermediary state variable at the time step by evaluating the MLD system model, and retaining the simulated value in the estimated initial state $x_0$.

2. The method as claimed in claim 1, comprising:
   identifying an intermediary sub-process and interconnecting two peripheral sub-processes, wherein the two MLD sub-system models representing the two peripheral sub-processes are only interacting via the intermediary sub-process; and
   designating the state variables of the MLD sub-system representing the intermediary sub-process as intermediary states.

3. The method as claimed in claim 2, wherein the industrial process is a flotation process, and the MLD subsystem models include at least one of a tank level, a flow rate and a valve percentage as a state.

4. The method as claimed in claim 2, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

5. The method as claimed in claim 1, comprising:
   adding to the objective function J, at least at one point in time during the optimization, a regularization term including a convex function of a difference between a function of the model outputs ŷ and an artificial observation y.

6. The method as claimed in claim 5, wherein the industrial process is a flotation process, and the MLD subsystem models include at least one of a tank level, a flow rate and a valve percentage as a state.

7. The method as claimed in claim 5, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

8. The method as claimed in claim 1, comprising:
   adding correction terms to an evolution of a process variable that is subject to at least one of changing process conditions and differences between the model and the plant; and
   implementing a correction term by one of (i) a single state evolving as a constant and subject to process noise, and (ii) a first-order filter with a constant input and subject to process noise.

9. The method as claimed in claim 8, wherein the industrial process is a flotation process, and the MLD subsystem models include at least one of a tank level, a flow rate and a valve percentage as a state.

10. The method as claimed in claim 8, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

11. The method as claimed in claim 1, wherein the merged MLD system involves vectors of states, vectors of inputs and vectors of outputs, and is a combination of two arbitrarily interconnected MLD subsystems each involving respective vectors of states, respective vectors of inputs, respective vectors of outputs, respective real auxiliary variables and respective Boolean auxiliary variables, and being described by respective state and output equations and constraints, and wherein:

the two subsystems are interconnected via dependent pairs formed by a dependent output of one subsystem and a dependent input of the other subsystem;

independent inputs and outputs of the subsystems are not part of the dependent pairs;

a state vector of the combined system is composed of the corresponding states of the subsystems, and the input and output vectors of the combined system are composed of the corresponding independent inputs and outputs of the subsystems;

first dependent pairs are eliminated from the merged MLD system by replacing each occurrence of the dependent inputs in the MLD matrices by a linear combination defining the dependent input;

second dependent pairs are replaced by additional auxiliary real and/or Boolean variables of the combined system; and the output equations for the second dependent outputs of each subsystem are converted into additional constraints of the combined system involving the additional auxiliary real and/or Boolean variables.

12. The method as claimed in claim 11, wherein the industrial process is a flotation process, and the MLD subsystem models include at least one of a tank level, a flow rate and a valve percentage as a state.

13. The method as claimed in claim 11, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

14. The method as claimed in claim 1, wherein the industrial process is a flotation process, and the MLD subsystem models include at least one of a tank level, a flow rate and a valve percentage as a state.

15. The method as claimed in claim 1, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

16. The method as claimed in claim 1, comprising:
adding to the constraints of the optimization problem, at selected time steps of the optimization, an artificial observation y.

17. The method as claimed in claim 16, wherein the industrial process is a flotation process, and the MLD subsystem models include at least one of a tank level, a flow rate and a valve percentage as a state.

18. The method as claimed in claim 16, wherein the industrial plant is a cement kiln, and the MLD subsystem models include at least one of a preheater cyclone temperature, oxygen level, burning zone temperature, precalciner temperature, cooler temperature, material flow rate, gas flow rate, a heat input by combustion, or an actuator position as a state.

19. A device for controlling an industrial process, based on an estimated initial state and a merged Mixed Logical Dynamic (MLD) system model of the industrial process, the merged MLD system model being a combination of MLD subsystem models representing sub-processes of the industrial process, the device comprising a processor configured to:

optimize, as a function of state variables x, an objective function J comprising a difference between observed quantities y and outputs $\hat{y}$ of the merged MLD system model for the industrial process, the optimization being performed over a number of time steps in the past and being subject to constraints defined by dynamics of the merged MLD system model;

retain optimizing values $x_0$ of the state variables at a time step as the estimated initial state, the time step being an optimized time step at which the optimizing values $x_0$ of the state variables are estimated to occur;

exclude the intermediary state variable from the optimization; and simulate a value of the intermediary state variable at the time step by evaluating the MLD system model, and retain the simulated value in the estimated initial state $x_0$.

20. A non-transitory computer-readable recording medium having a program recorded thereon that causes a processor of a computer processing device to estimate initial states of a system model for an industrial process with a plurality of sub-processes, the program causing the processor to execute operations comprising:

optimizing, as a function of state variables x, an objective function J including a difference between observed quantities y and outputs $\hat{y}$ of a merged Mixed Logical Dynamic (MLD) system model for the industrial process, the optimization being performed over a number of time steps in the past and being subject to constraints defined by dynamics of the merged MLD system model, wherein the merged MLD system model is a combination of MLD subsystem models representing the sub-processes of the industrial process;

retaining optimizing values $x_0$ of the state variables at a time step as an estimated initial state for control, based on the merged MLD system model, of the industrial process, wherein the state variables include an intermediary state variable, and the time step is an optimized time step at which the optimizing values $x_0$ of the state variables are estimated to occur;

excluding the intermediary state variable from the optimization; and simulating a value of the intermediary state variable at the time step by evaluating the MLD system model, and retaining the simulated value in the estimated initial state $x_0$.

* * * * *